United States Patent [19]
Chi et al.

[11] Patent Number: 5,908,311
[45] Date of Patent: Jun. 1, 1999

[54] METHOD FOR FORMING A MIXED-SIGNAL CMOS CIRCUIT THAT INCLUDES NON-VOLATILE MEMORY CELLS

[75] Inventors: Min-hwa Chi, Palo Alto; Chih-sieh Teng, San Jose; Albert Bergemont, Palo Alto, all of Calif.

[73] Assignee: National Semiconductor Corporation, Santa Clara, Calif.

[21] Appl. No.: 08/690,203

[22] Filed: Jul. 25, 1996

[51] Int. Cl.⁶ .............................................. H01L 21/8247
[52] U.S. Cl. .......................................... 438/258; 438/585
[58] Field of Search .................................. 438/258, 257, 438/259–267, 585; 257/315–324

[56] References Cited

U.S. PATENT DOCUMENTS

| | | |
|---|---|---|
| 5,188,976 | 2/1993 | Kume et al. . |
| 5,477,485 | 12/1995 | Bergemont et al. ............... 365/185.24 |
| 5,500,387 | 3/1996 | Tung et al. . |
| 5,511,021 | 4/1996 | Bergemont et al. ............... 365/185.03 |
| 5,557,567 | 9/1996 | Bergemont et al. . |
| 5,587,332 | 12/1996 | Chang et al. . |
| 5,587,949 | 12/1996 | Bergemont et al. . |
| 5,594,685 | 1/1997 | Bergemont et al. . |
| 5,658,812 | 8/1997 | Araki ...................................... 438/258 |
| 5,674,762 | 10/1997 | See et al. . |
| 5,702,988 | 12/1997 | Liang ...................................... 438/238 |
| 5,712,178 | 1/1998 | Cho et al. . |

OTHER PUBLICATIONS

Chi, M. et al., "*Multi–level Flash/EPROM Memories: New Self–convergent Programming Methods for Low–voltage Applications*," Tech. Digest of IEDM, pp. 271–274 (1995).

Paterson, J., "*Adding Analog, EPROM and EEPROM modules to CMOS Logic Technology: How modular?*" Tech. Digest of IEDM, pp. 413–416 (1989).

Lai, S.K et al., "*Comparison and Trends in Today's Dominant $E^2$ Technologies*," Tech. Digest of IEDM, pp. 580–583 (1986).

Aritome, S. et al., "*Reliability Issues of Flash Memory Cells*," invited paper, proceedings of the IEEE, vol. 81, No. 5, pp. 776–787 (May, 1993).

Codella, C.F. et al., "*Halo Doping Effects in Submicron DI–LDD Device Design*," Tech. Digest of IEDM, pp. 230–233 (1985).

Hori, A. et al., "*A Self–Aligned Pocket Implantation (SPI) Technology for 0.2 μm–Dual Gate CMOS*," Tech. Digest of IEDM, pp. 641–644 (1991).

Cheng, H. et al., "*Superior Low–Pressure–Oxidized $Si_3N_4$ Films on Rapid–Thermal–Nitrided Poly–Si for High–Density DRAM's*," IEEE Electron Device Letters, vol. 16, No. 11, pp. 509–511 (1995).

Wann, H. et al., "*Suppressing Flash EEPROM Erase Leakage with Negative Gate Bias and LDD Erase Junction*," Dept. of Elect. Engineering & Comp. Sci., Berkeley, CA, pp. 81–82 (1993).

Manos, Pete et al., "*A Self–Aligned EPROM Structure with Superior Data Retention*," IEEE Electron Device Letters, vol. 11, No. 7, pp. 309–311, Jul. 1990.

U.S. Application 08/654,103, filed May 28, 1996, Chi et al.

*Primary Examiner*—Richard A. Booth
*Attorney, Agent, or Firm*—Limbach & Limbach L.L.P.

[57] ABSTRACT

A CMOS device that includes three-volt MOS transistor, five-volt MOS transistors, FLASH EPROM cells, poly resistors, and double-poly capacitors is formed in a single integrated CMOS process flow. The FLASH EPROM cells are formed as single-transistor memory cells that operate on low to very-low voltages.

26 Claims, 15 Drawing Sheets

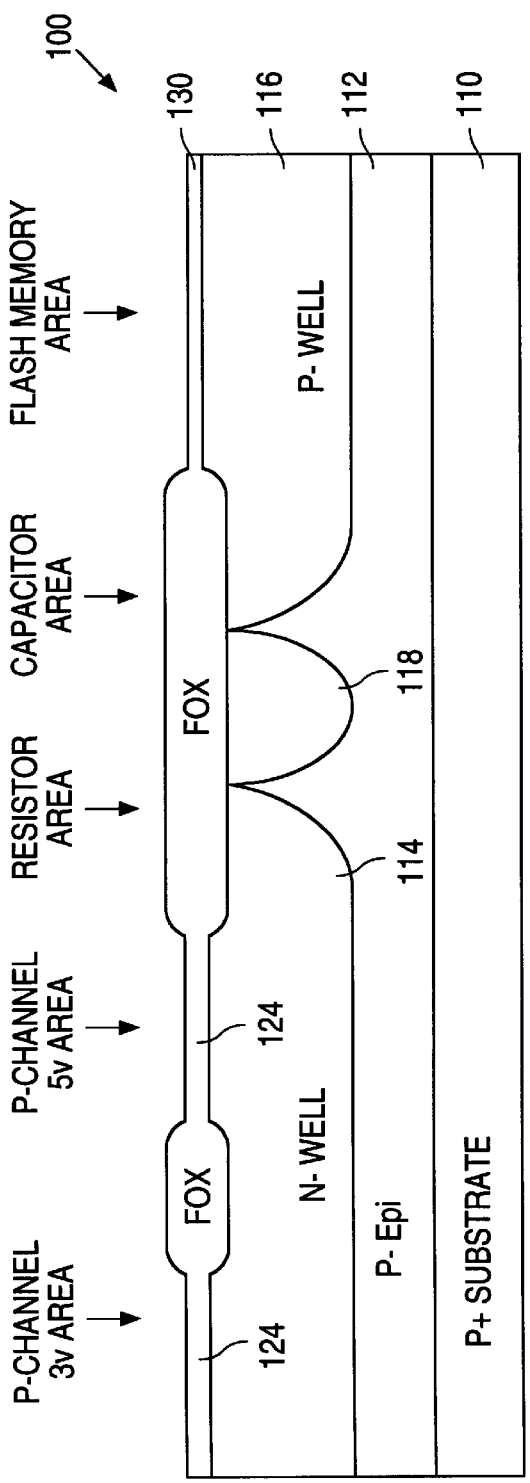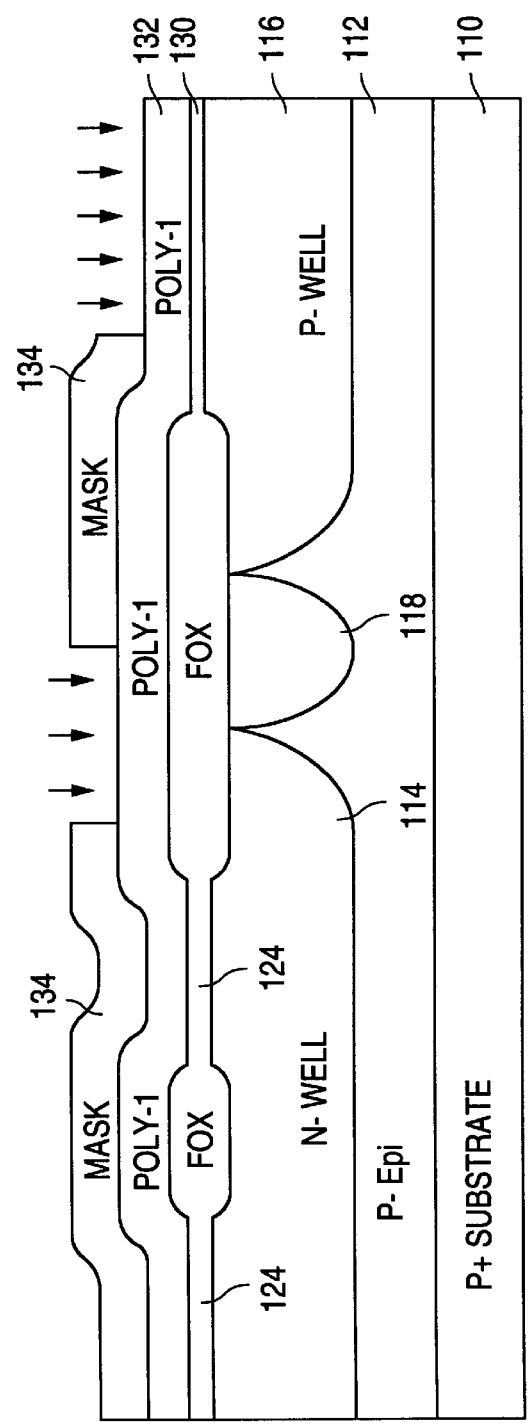

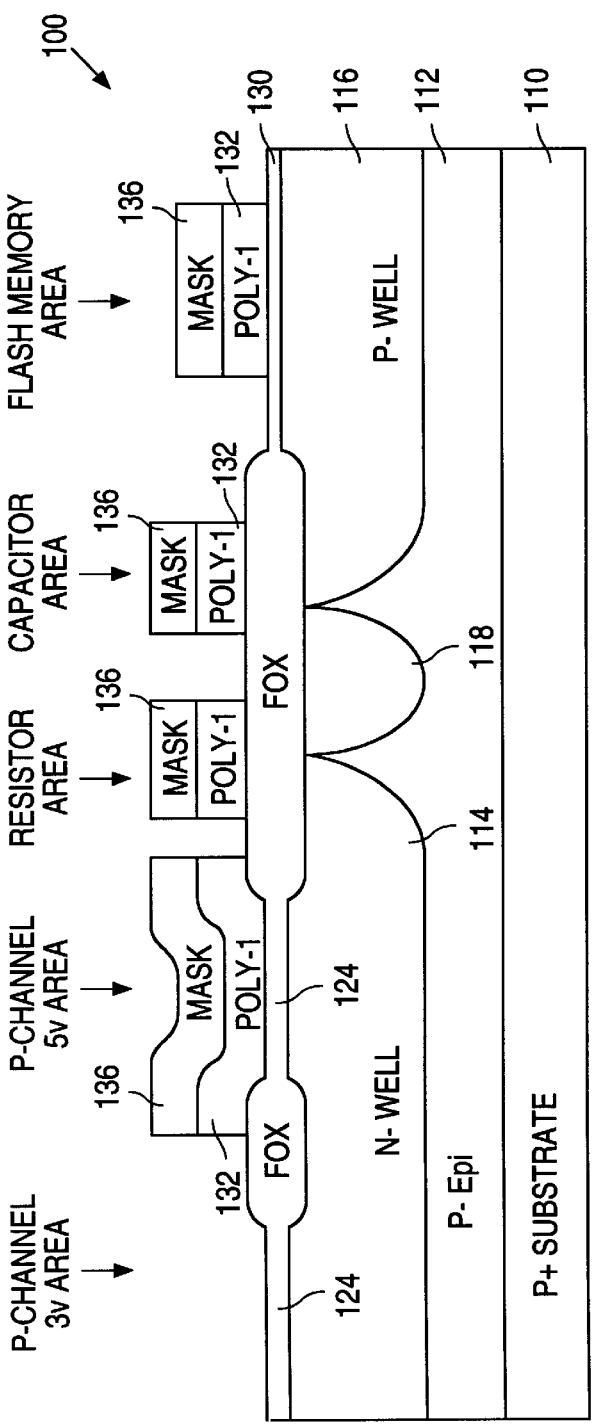
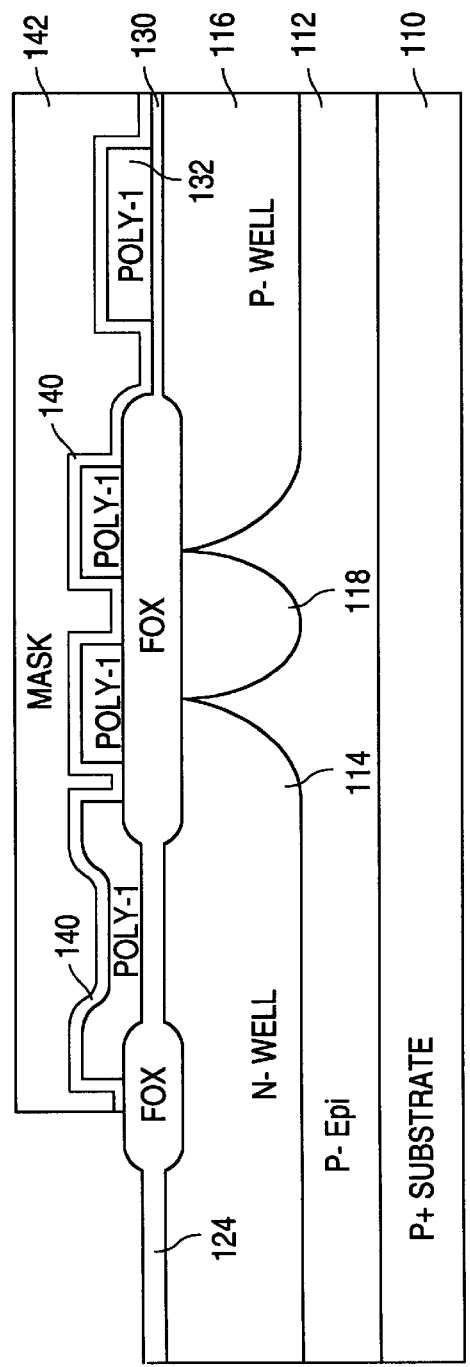
FIG. 1E
FIG. 1F

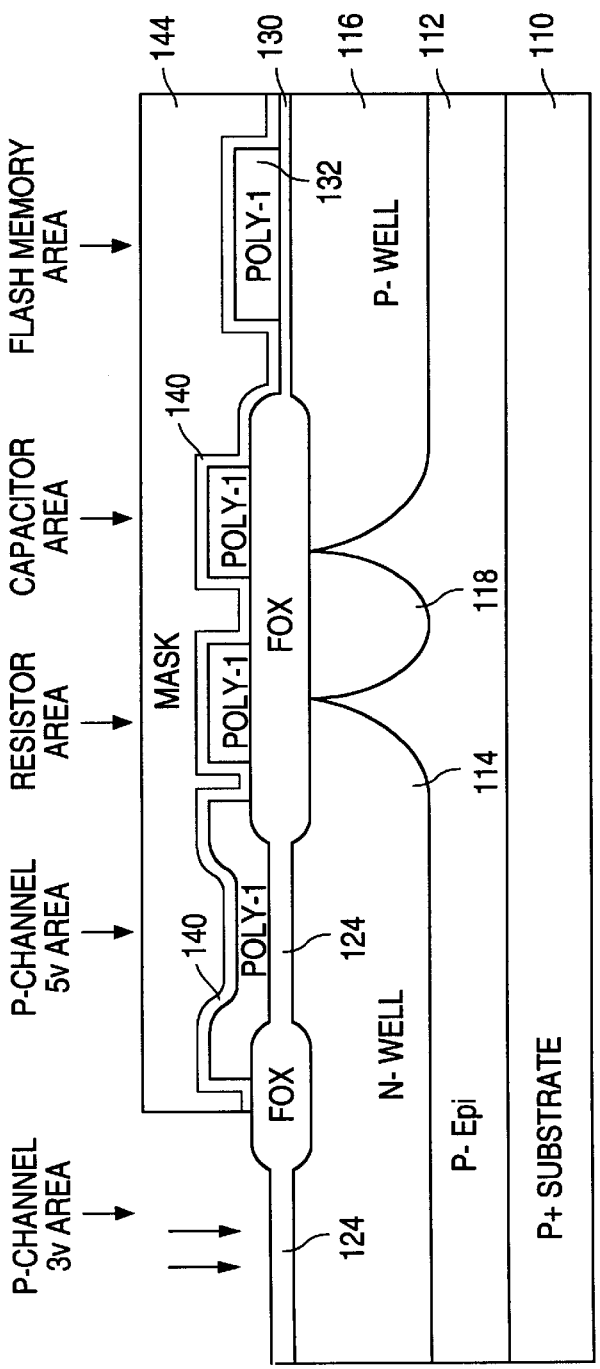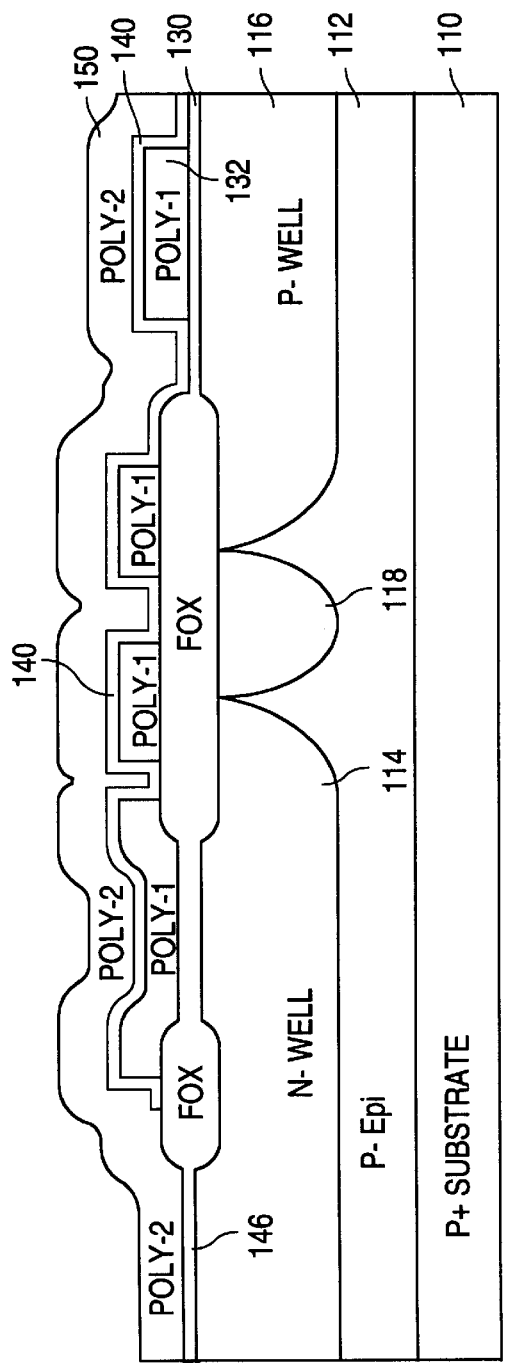
FIG. 1G
FIG. 1H

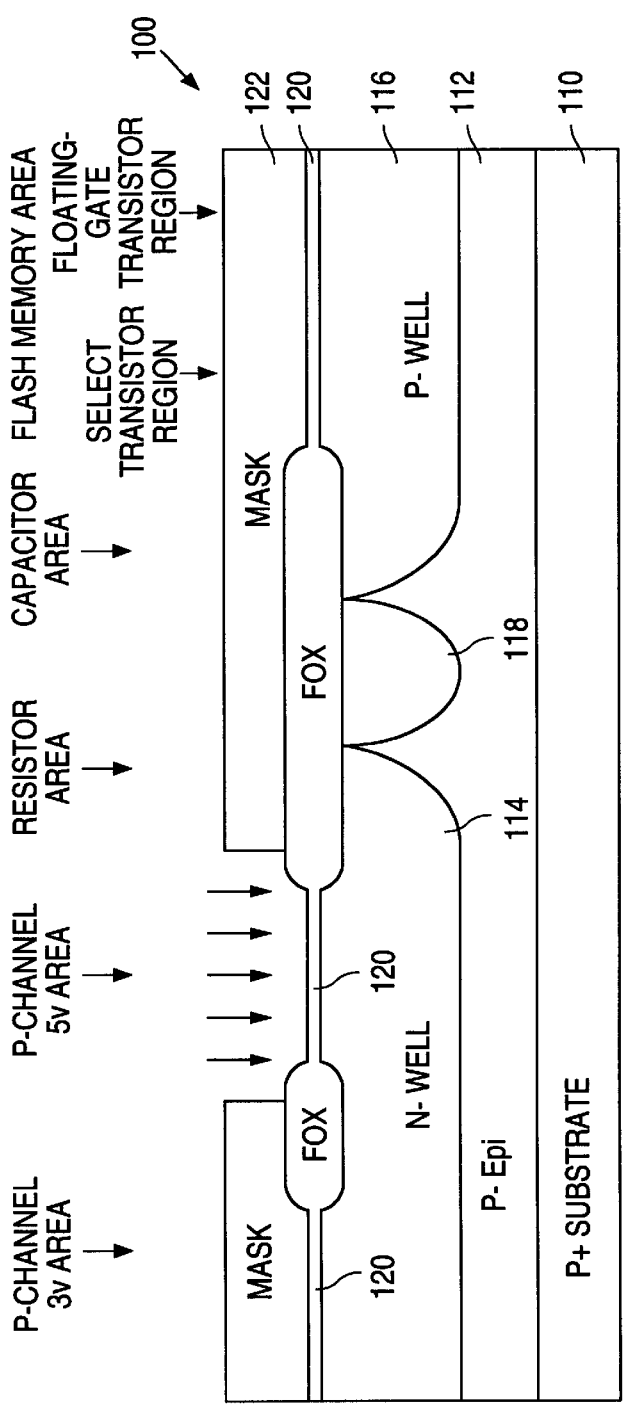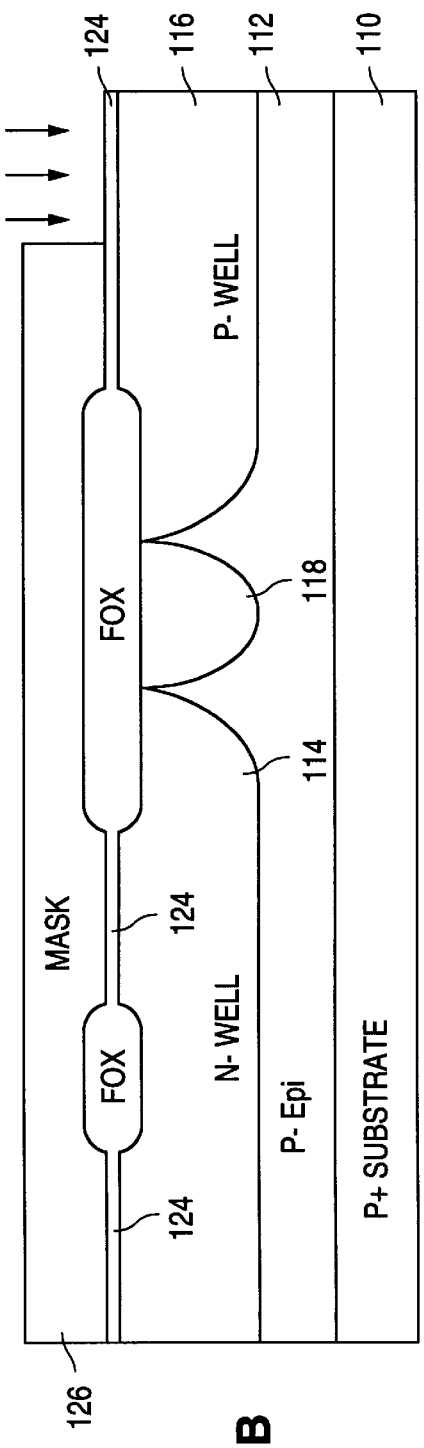
FIG. 2A
FIG. 2B

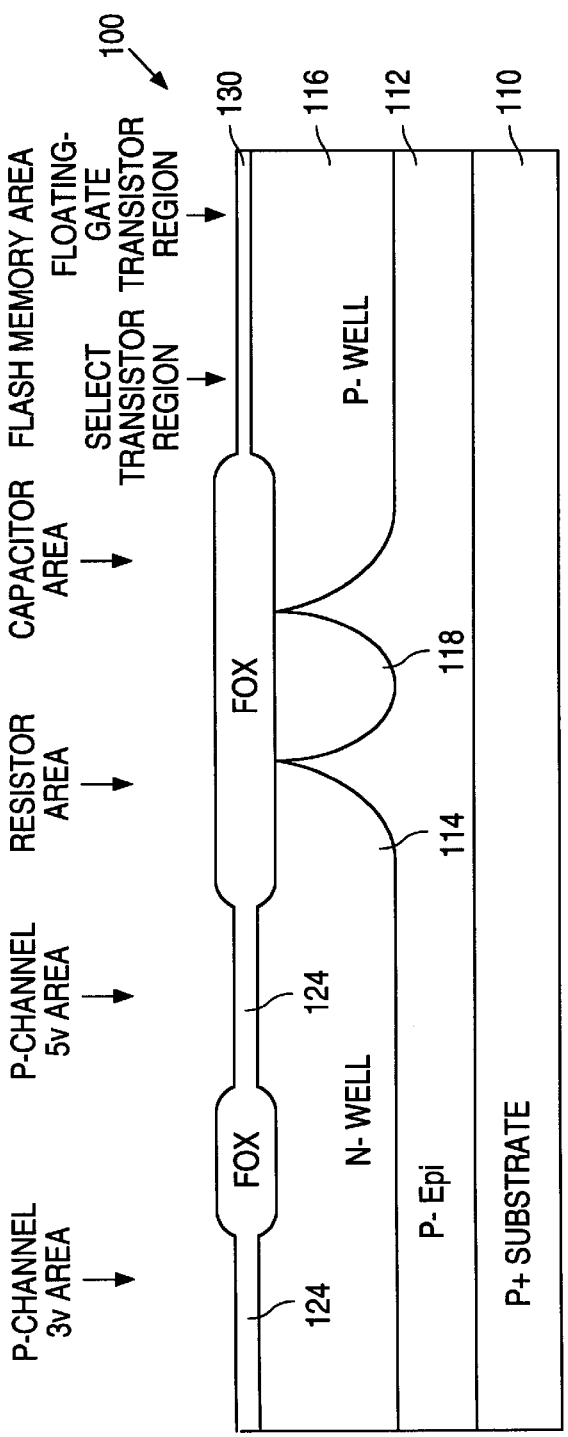
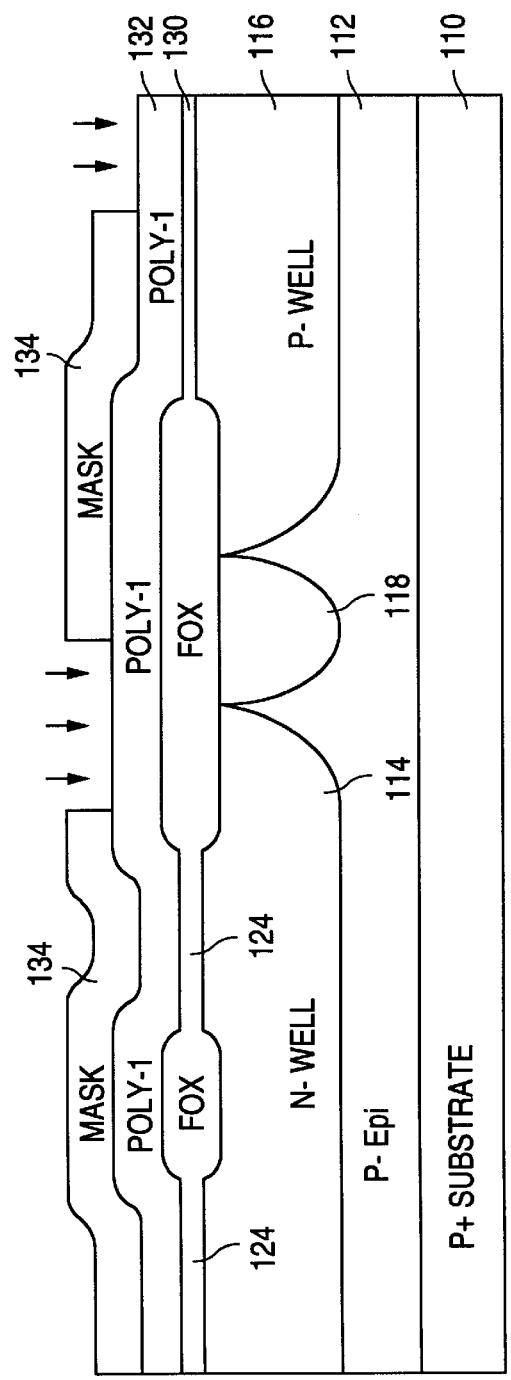
FIG. 2C
FIG. 2D

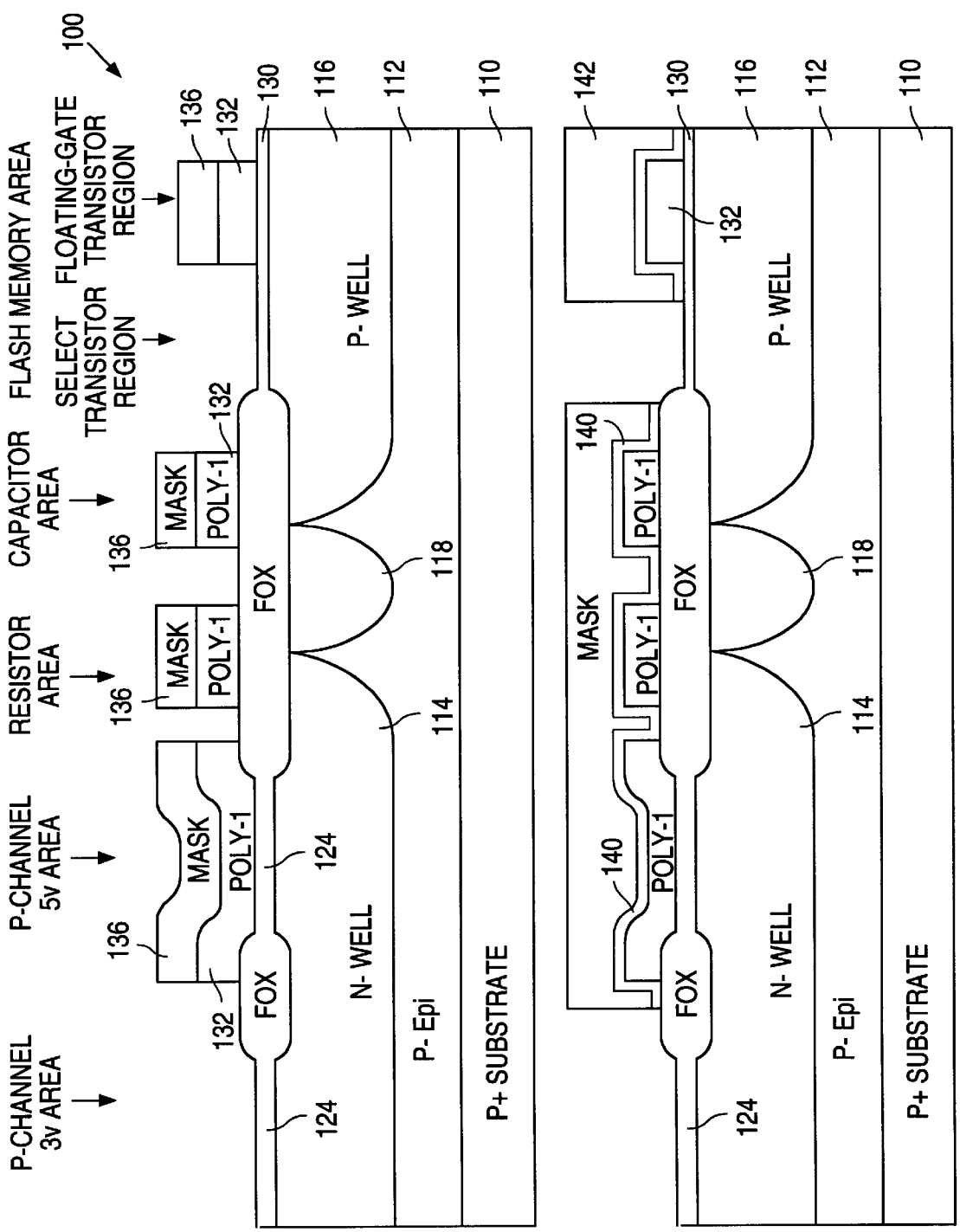

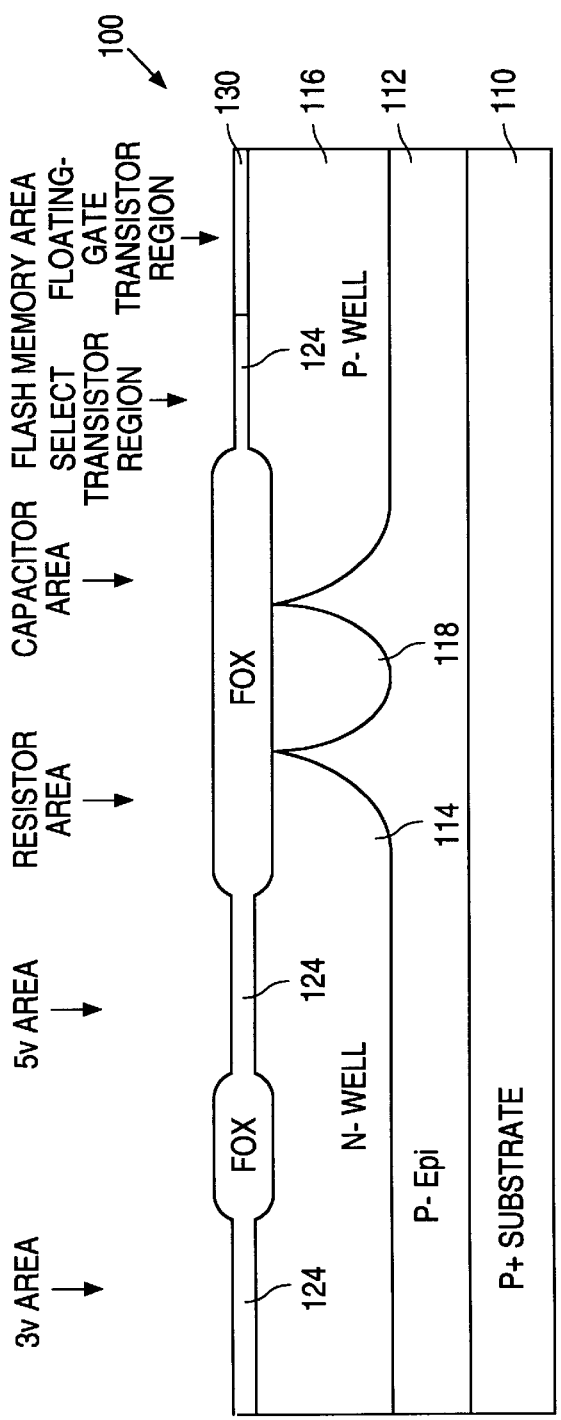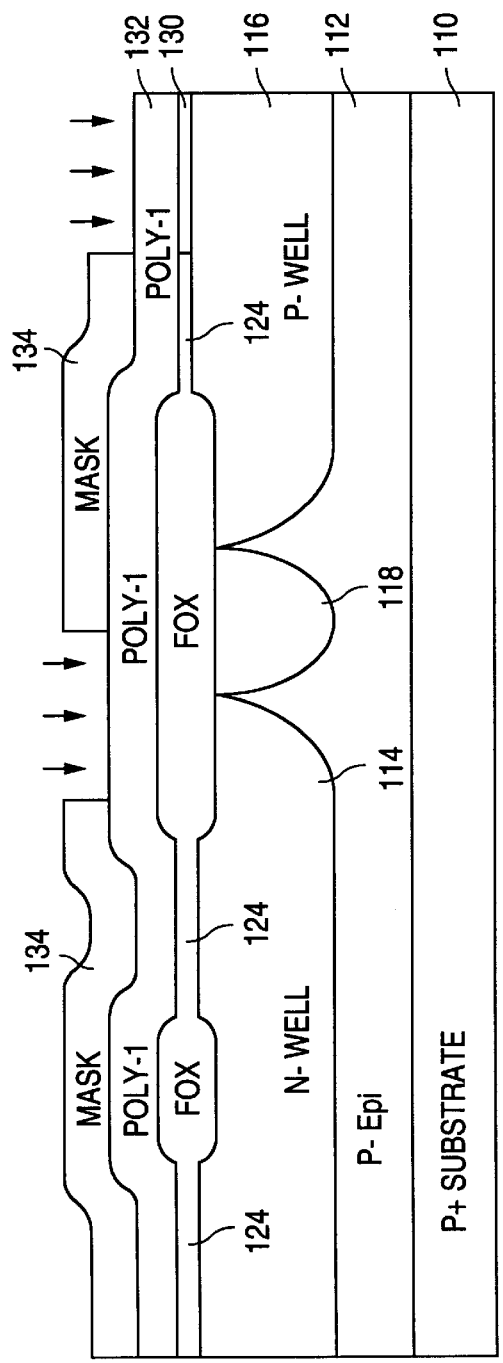
FIG. 3C
FIG. 3D

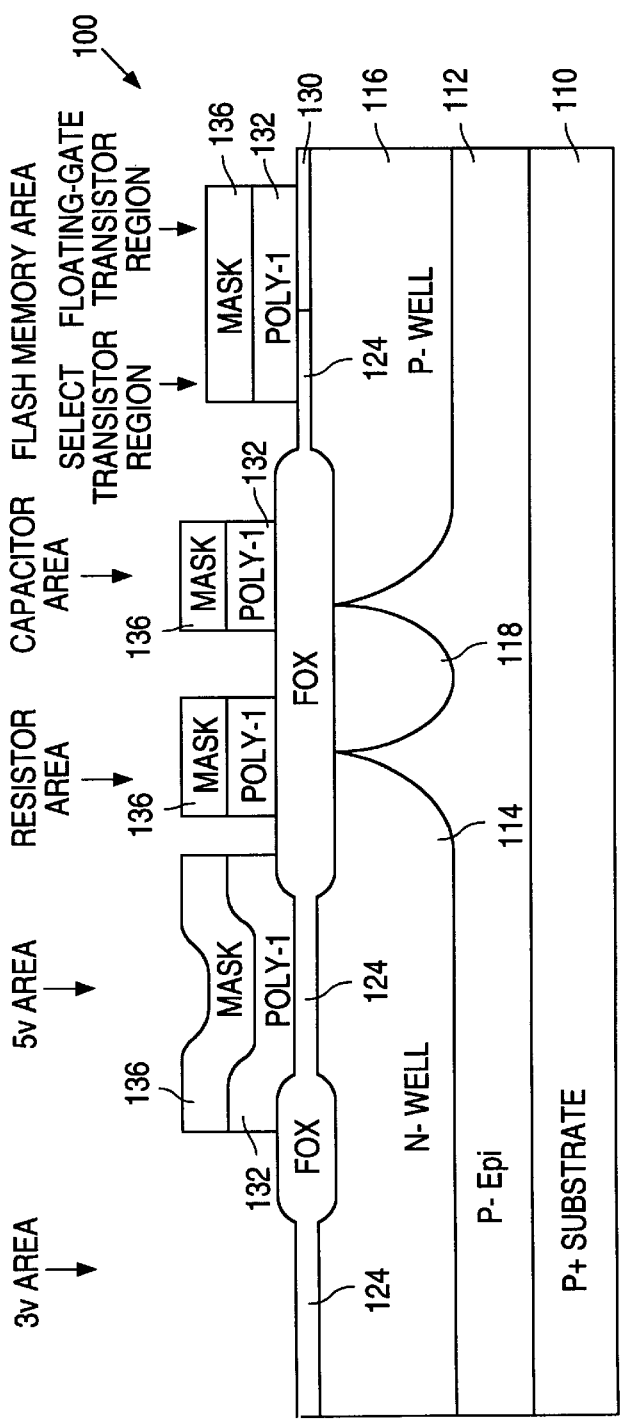
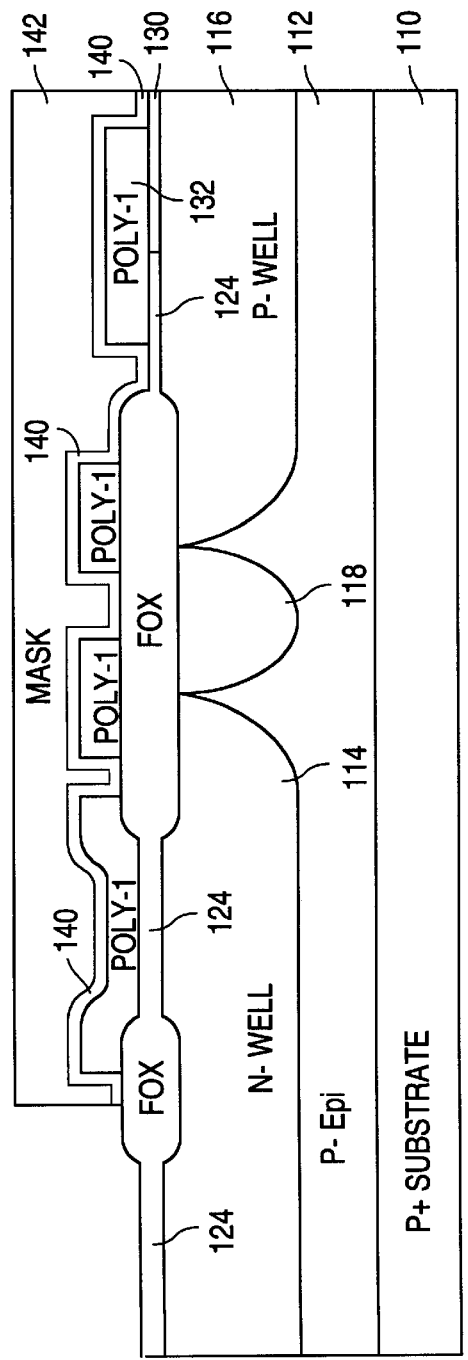

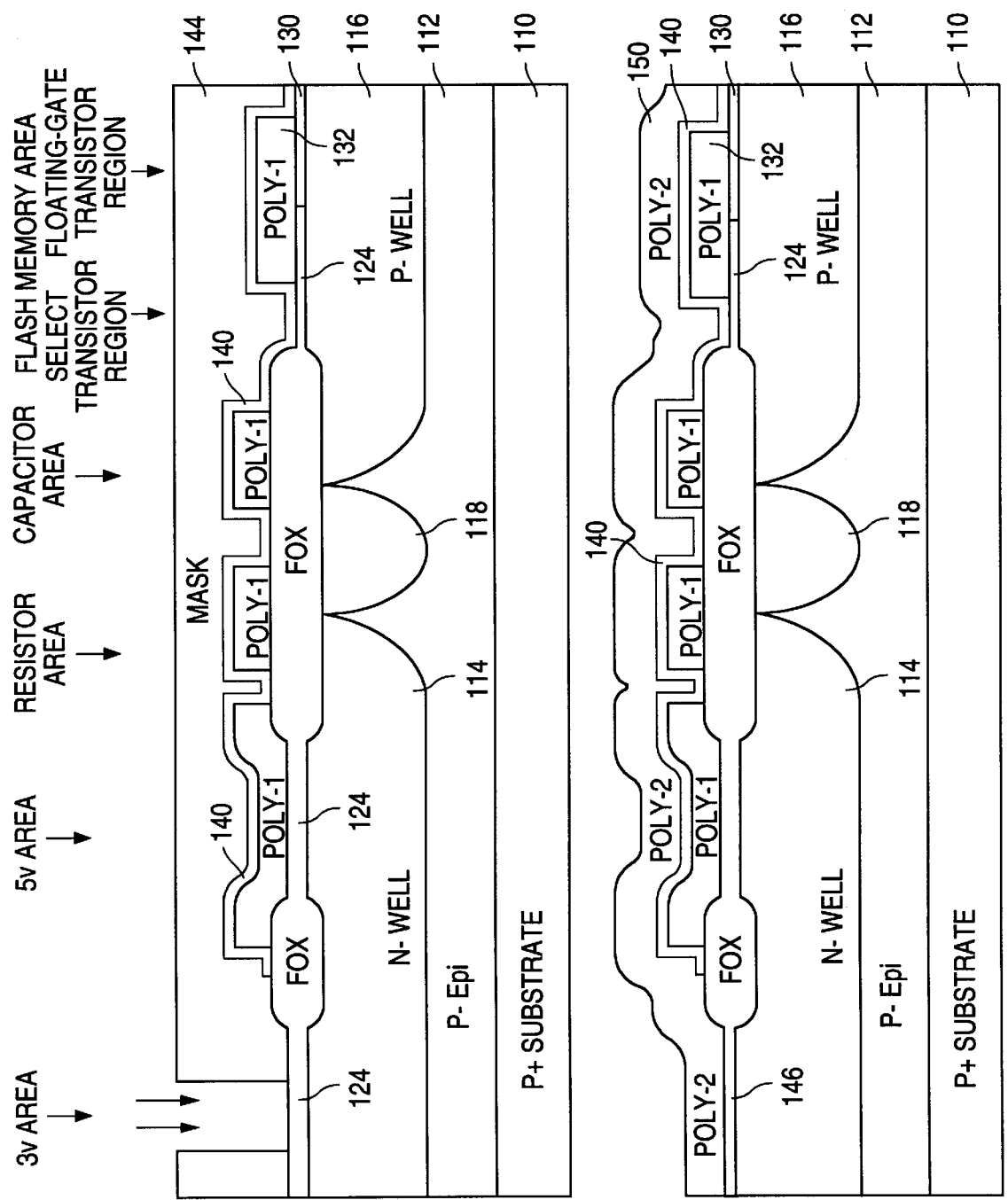

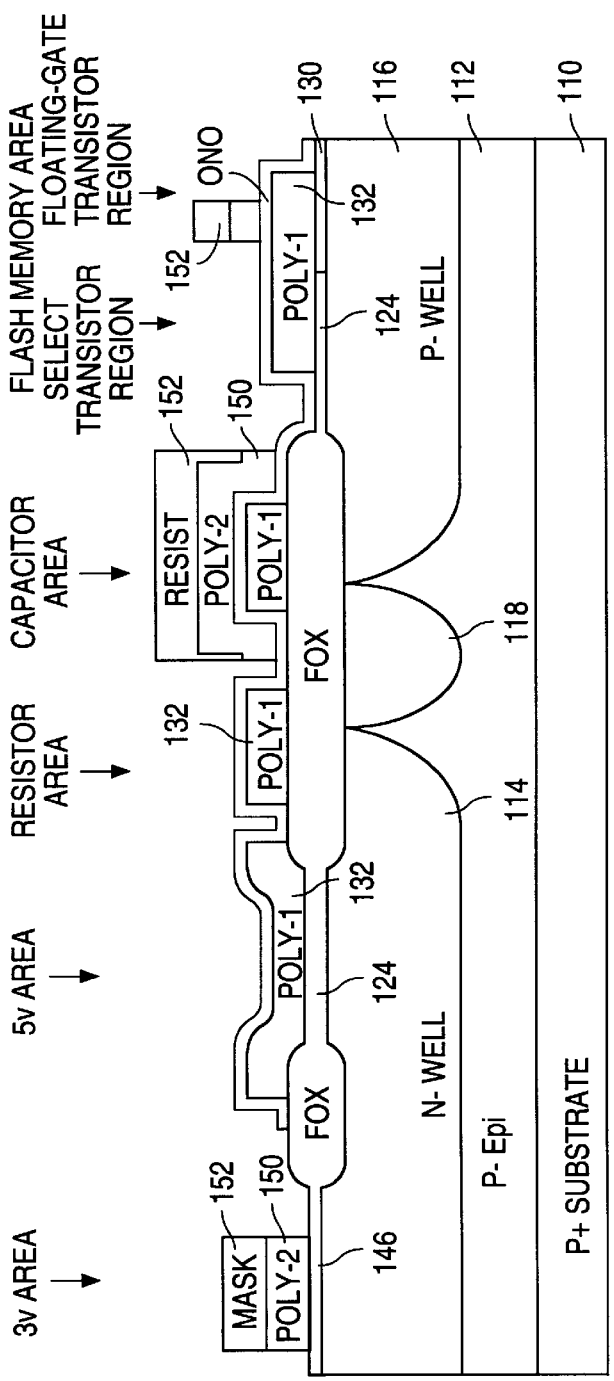
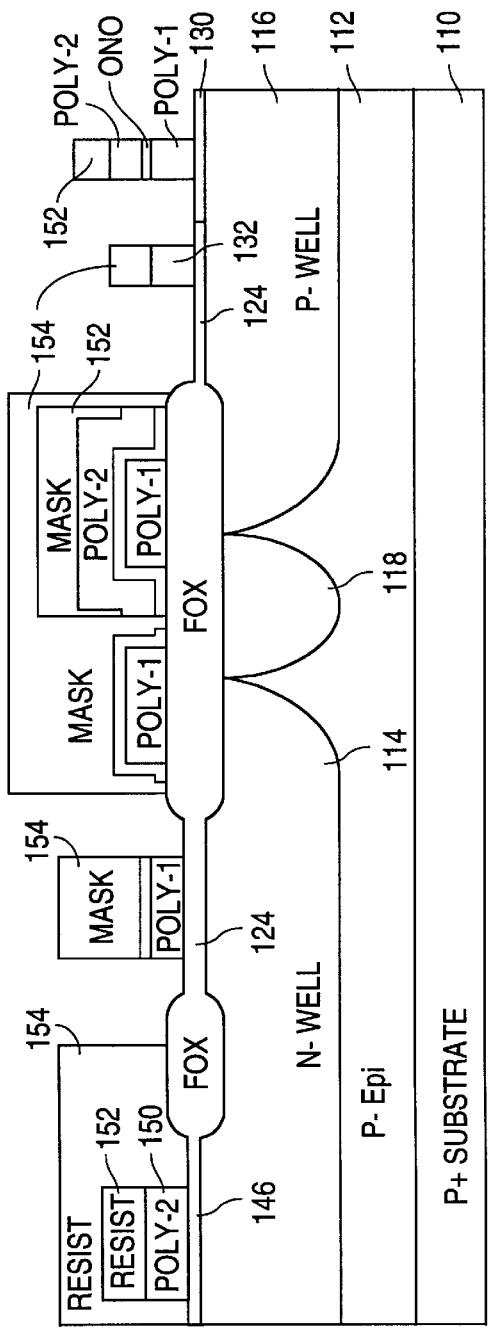
FIG. 3I
FIG. 3J

METHOD FOR FORMING A MIXED-SIGNAL CMOS CIRCUIT THAT INCLUDES NON-VOLATILE MEMORY CELLS

BACKGROUND OF THE INVENTION

1. Field of the Invention

The present invention relates to a method for forming CMOS circuits and, more particularly, to a method for forming mixed-signal CMOS circuits that include electrically-erasable non-volatile memory cells.

2. Description of the Related Art

Historically, the integration of electrically-erasable non-volatile memory cells into mixed-signal CMOS circuits (analog and digital circuits) has been hampered by the higher voltage requirements of the memory cells. The higher voltage requirements, in turn, require increased isolation, thicker gate oxide, deeper junctions, and additional voltage sources that substantially increase the device size and the process complexity required to make an integrated device.

For example, current CMOS logic devices utilize minimal isolation and shallow junction depths, and operate on approximately 3.3 volts. Analog devices have similar isolation and junction depth requirements, but typically operate on 5.0 volts to obtain a wider dynamic range.

On the other hand, conventional electrically-erasable non-volatile memory cells, such as floating-gate tunneling oxide (FLOTOX) EEPROM and FLASH EPROM cells, utilize significantly more isolation and deeper junction depths, and typically require 12–15volts to program and erase the cells.

Recently, however, low-voltage FLASH EPROM cells based on one and two transistor configurations have been described in U.S. Pat. Nos. 5,477,485 and 5,511,021, and U.S. patent application Ser. Nos. 08/422,146 and 08/654,103. These transistor configurations require significantly less isolation, shallower junction depths, and lower operational voltages.

As a result, there is a need for a method for fabricating mixed-signal CMOS circuits that include these transistor configurations.

SUMMARY OF THE INVENTION

The present invention provides a method for forming low-voltage FLASH EPROM cells in a mixed-signal CMOS process flow. The method, which forms three-volt transistors in a three-volt area of a semiconductor material, five-volt transistors in a five-volt area of the semiconductor material, and floating-gate transistors in a memory area of the semiconductor material, begins with the step of setting the threshold voltages of the five-volt transistors in the five-volt area. After the threshold voltages have been set, a layer of gate oxide is formed over the five-volt area. Next, the process is repeated in the memory area by setting the threshold voltages of the floating-gate transistors in the memory area, followed by the formation of a layer of gate oxide over the memory area. Once the threshold voltages have been set, a layer of first polysilicon (poly-1) is formed over the three-volt, five-volt, and memory areas. The layer of poly-1 is then selectively removed from the five-volt area to form a first region of poly-1, the memory area to form a second region of poly-1, and the three-volt area. After this, a layer of dielectric material is formed over the three-volt, five-volt, and memory areas. Following this, the layer of dielectric material is removed from the three-volt area. Next, the threshold voltages of the three-volt transistors are set, followed by the formation of a layer of gate oxide over the three-volt area. Once the layer of gate oxide has been formed over the three-volt area, a layer of second polysilicon (poly-2) is formed over the five-volt, memory, and three-volt areas. Next, the layer of poly-2 is selectively removed from the memory area to form a control gate, and from the three-volt area to form a gate. Following this, the layer of dielectric material and the underlying layer of poly-1 are selectively removed from the five-volt area to form a gate, and the memory area to form a floating gate.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIGS. 1A–1J are cross-sectional drawings illustrating a method for forming a mixed-signal CMOS device that includes non-volatile memory cells in accordance with the present invention.

FIGS. 2A–2J are cross-sectional drawings illustrating a method for forming a mixed-signal CMOS device that includes a two-transistor memory cell configuration that utilizes a three-volt select transistor in accordance with the present invention.

FIGS. 3A–3J are cross-sectional drawings illustrating a method for forming a mixed-signal CMOS device that includes a two-transistor memory cell configuration that utilizes a five-volt select transistor in accordance with the present invention.

DETAILED DESCRIPTION

FIGS. 1A–1J show cross-sectional drawings that illustrate a method for forming a mixed-signal CMOS device in accordance with the present invention. As described in greater detail below, the present invention provides a method for forming three and five-volt MOS transistors, FLASH EPROM cells, poly resistors, and double-poly capacitors in a single integrated CMOS process flow.

Figure 1A:
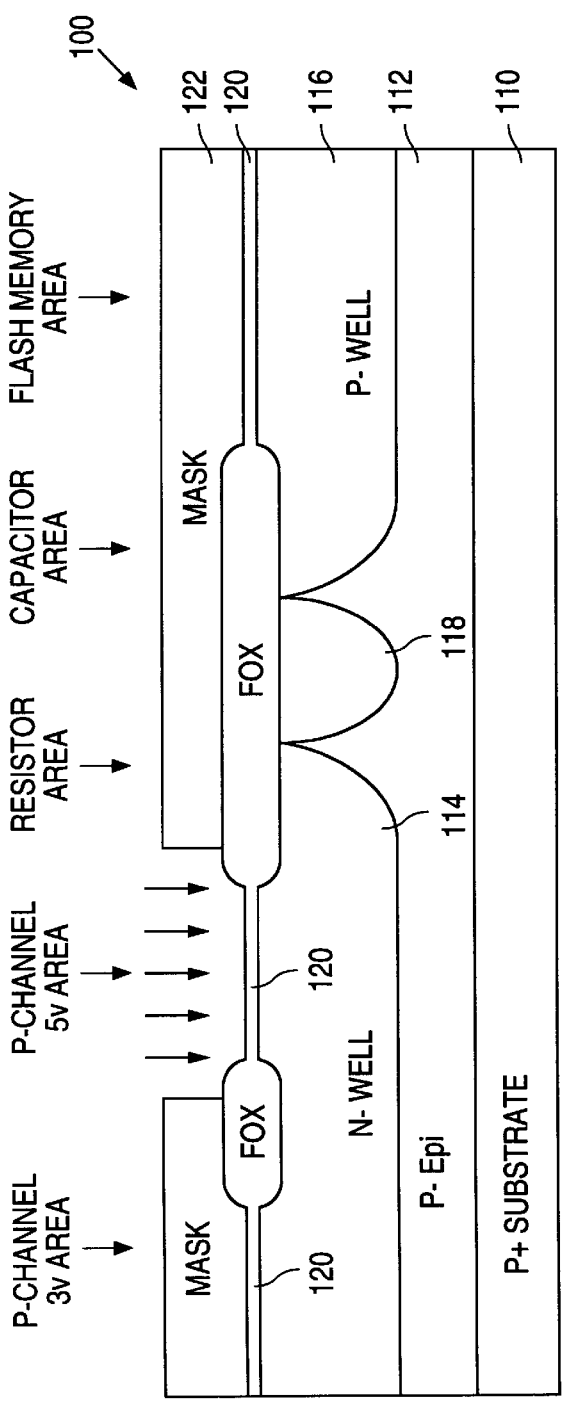

As shown in FIG. 1A, the process of the present invention begins with the conventional formation of a semiconductor device 100 that includes a p+ substrate 110, a p– epi layer 112, a transistor n-well 114, a memory p-well 116, a transistor p-well (not shown), a channel stop implant 118, and a series of LOCOS-formed field oxide regions FOX.

Following the conventional formation of device 100, the next step is to set the threshold voltages of the n and p-channel five-volt transistors. To set the threshold voltages, a layer of sacrificial oxide 120 approximately 400Å thick is first formed over the transistor p-well, the transistor n-well 114, and the memory p-well 116.

Next, a threshold voltage mask 122 is formed and patterned over the layer of sacrificial oxide 120 to expose the layer of sacrificial oxide 120 formed over a p-channel 5 V area of n-well 114. Following this, the p-channel 5 V area is implanted with a dopant, such as boron, arsenic, or phosphorous, to set the threshold voltages of the p-channel 5 V transistors. (Boron is used to lower the concentration, while arsenic and phosphorous are used to increase the concentration).

After the threshold voltages of the p-channel 5 V transistors have been set, mask 122 is removed and the process is repeated with the formation of a threshold voltage mask (not shown) that exposes the layer of sacrificial oxide 120 formed over an n-channel 5 V area of the transistor p-well. The area is then implanted with boron or other similar materials to set the threshold voltages of the n-channel 5 V transistors.

Figure 1B:
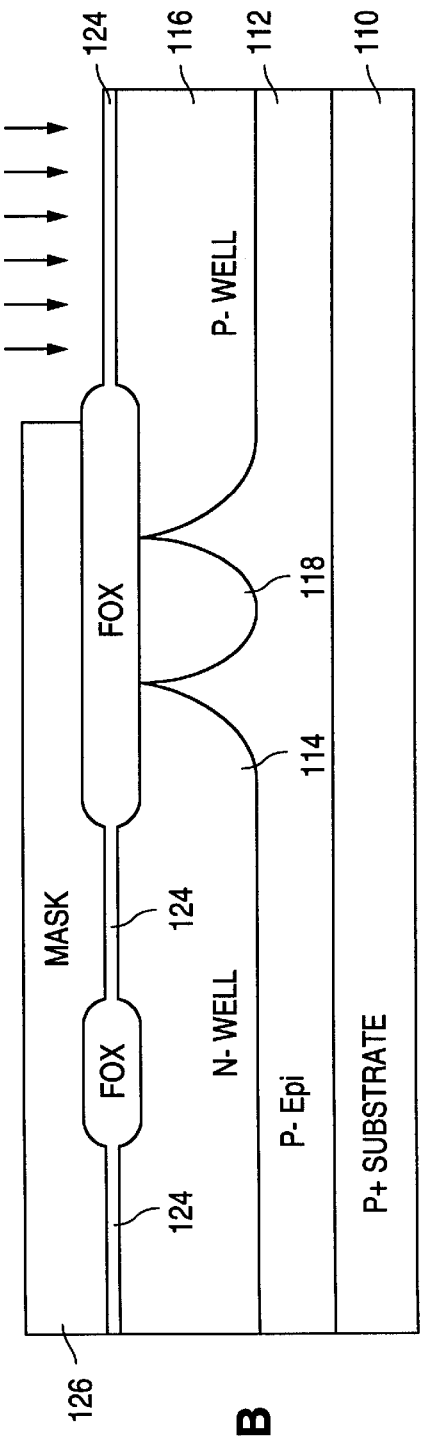

Referring to FIG. 1B, once the threshold voltages of the n-channel 5 V transistors have been set, the n-channel 5 V threshold voltage mask is removed, followed by the removal of sacrificial oxide layer 120. (The threshold voltages of the n-channel 5 V transistors may alternately be set before setting the threshold voltages of the p-channel 5 V transistors).

After the threshold voltages of the five-volt transistors have been set and the layer of sacrificial oxide 120 has been removed, a layer of gate oxide 124 approximately 80 Å thick is grown over the transistor p-well, the transistor n-well 114 and the memory p-well 116.

Following this, the next step is to set the threshold voltages of the n-channel FLASH EPROM cells. To set the threshold voltages, a threshold voltage mask 126 is formed over the layer of gate oxide 124 to expose the layer of gate oxide 124 formed over a FLASH memory area of memory p-well 116. Next, the FLASH memory area is implanted with boron or other similar materials to set the threshold voltages of the memory cells.

Turning to FIG. 1C, once the threshold voltages of the FLASH EPROM cells have been set, the layer of gate oxide 124 formed over the FLASH memory area is removed, followed by the removal of mask 126. After mask 126 has been removed, a layer of gate oxide 130 approximately 70 Å thick is grown over the FLASH memory area. The process of growing gate oxide layer 130 increases the thickness of the layer of gate oxide 124 to approximately 130 Å because gate oxide layer 124 grows at a slower rate than does gate oxide layer 130.

Referring now to FIG. 1D, after gate oxide layer 130 has been grown, a first layer of polysilicon (poly-1) 132 approximately 2,000 521 thick is deposited over gate oxide layers 124 and 130, and field oxide regions FOX. Following this, a first implant mask 134 is formed and patterned to expose the layer of poly-1 132 formed over a resistor area and the FLASH memory area.

Next, the exposed portions of poly-1 layer 132 are implanted with arsenic or other similar materials at an implant energy of approximately 45 KeV with an implant dosage in the range of approximately $1-5 \times 10^{14}$ ions/cm² to dope poly-1 layer 132 in the resistor and FLASH memory areas in order to optimize the (low) doping of the to-be-formed resistors and floating gates. (optionally, this implantation step can be performed without mask 134 due to the low doping).

Following this, the process is reversed by removing mask 134 and forming a second implant mask (not shown) that protects the resistor and FLASH memory areas. Next, the exposed portions of poly-1 layer 132 are implanted with arsenic or other similar materials at an implant energy of approximately 45 KeV with an implant dosage in the range of approximately $5 \times 10^{15} - 1 \times 10^{16}$ ions/cm² to dope poly-1 layer 132 in a three-volt transistor area, a capacitor area, and the five-volt transistor area in order to optimize the (high) doping of the to-be-formed transistor gates and lower plates of the capacitors.

Thus, the process of the present invention allows the doping concentration for each of the poly-1 areas to be optimized. (The regions of higher doping may alternately be implanted before the regions of lower doping).

Next, as shown in FIG. 1E, a poly-1 mask 136 is formed and patterned to expose the three-volt transistor areas, and to define the resistors, the lower plates of the capacitors, the floating gates of the FLASH EPROMS, and the gate regions of the five-volt transistors. After this, poly-1 layer 132 is etched until the unmasked regions of poly-1 have been removed. Following this, mask 136 is removed.

Turning now to FIG. 1F, after mask 136 has been removed, a composite layer of oxide-nitride-oxide (ONO) 140 is formed over poly-1 layer 132, the exposed field oxide region FOX, and the layer of gate oxide 124 formed over the three-volt transistor areas. The process temperature of ONO layer 140 should be less than 900° C. to minimize the effect of thermal cycling. Rapid thermal processing (RTP) methods use very-low process temperatures and are ideal for this purpose.

The layer of ONO 140 seals the edges of the floating gates, the resistors, and the lower plates of the capacitors, thereby reducing oxidation encroachment at the edge of the layer of poly-1 132. Oxidation encroachment, in turn, can lead to reduced gate coupling, and increased charge loss from the cell, leakage from the capacitors, contamination, and resistance drift.

Next, an ONO mask 142 is formed and patterned to expose the three-volt transistor areas. After this, ONO layer 140 is etched until the unmasked regions of ONO have been removed, followed by the removal of mask 142.

Referring now to FIG. 1G, after mask 142 has been removed, the next step is to set the threshold voltages of the n and p-channel three-volt transistors. To set the threshold voltages, a threshold voltage mask 144 is formed and patterned over the layer of ONO 140 to expose the layer of gate oxide layer 124 that is formed over the p-channel 3 V area. Following this, the p-channel 3 V area is implanted with a dopant, such as boron, phosphorous, or arsenic, to set the threshold voltages of the p-channel 3 V transistors.

Once the threshold voltages of the p-channel 3 V transistors have been set, the layer of gate oxide 124 formed over the p-channel 3 V area is removed, followed by the formation of a layer of gate oxide 146 approximately 80 Å thick over the p-channel 3 V area.

One of the advantage of the present process flow is that the five-volt transistors, resistors, capacitors, and FLASH EPROM cells are fabricated before the three-volt transistors are fabricated. This results in no thermal cycle impact on the main 3 V circuit area.

After the threshold voltages of the p-channel 3 V transistors have been set and the layer of gate oxide 146 has been formed, mask 144 is removed and the process is repeated with the formation of an n-channel 3 V threshold voltage mask (not shown), the implantation of boron or other similar materials to set the threshold voltages of the n-channel 3 V transistors, and the formation of gate oxide layer 146 over the n-channel 3 V area. (The threshold voltages of the n-channel 3 V transistors may alternately be set before setting the threshold voltages of the p-channel 3 V transistors).

Another of the advantages of the present process flow is that the thickness of each of the layers of gate oxide, as well as the threshold voltages, can be optimized for the best performance for that device. Alternately, however, if the three-volt transistors and the floating-gate transistors utilize the same oxide thickness and the same threshold voltages, then mask 126 can be modified to expose the three-volt area as well as the FLASH memory area.

Under these conditions, the three-volt area is implanted and covered with a layer of gate oxide at the same time that the FLASH memory area is implanted and covered with gate oxide layer 130. In addition, the gates of the three-volt transistors are formed at the same time that the gates for the five-volt transistors are formed, thereby saving a number of masking steps.

Referring to FIG. 1H, once the layer of gate oxide 146 has been formed, a second layer of polysilicon (poly-2) 150 approximately 2,500 Å thick is deposited over gate oxide layer 146, the exposed field oxide region FOX, and the layer of ONO 140. Poly-2 layer 150 is then conventionally doped.

Figures 1I, 1J:
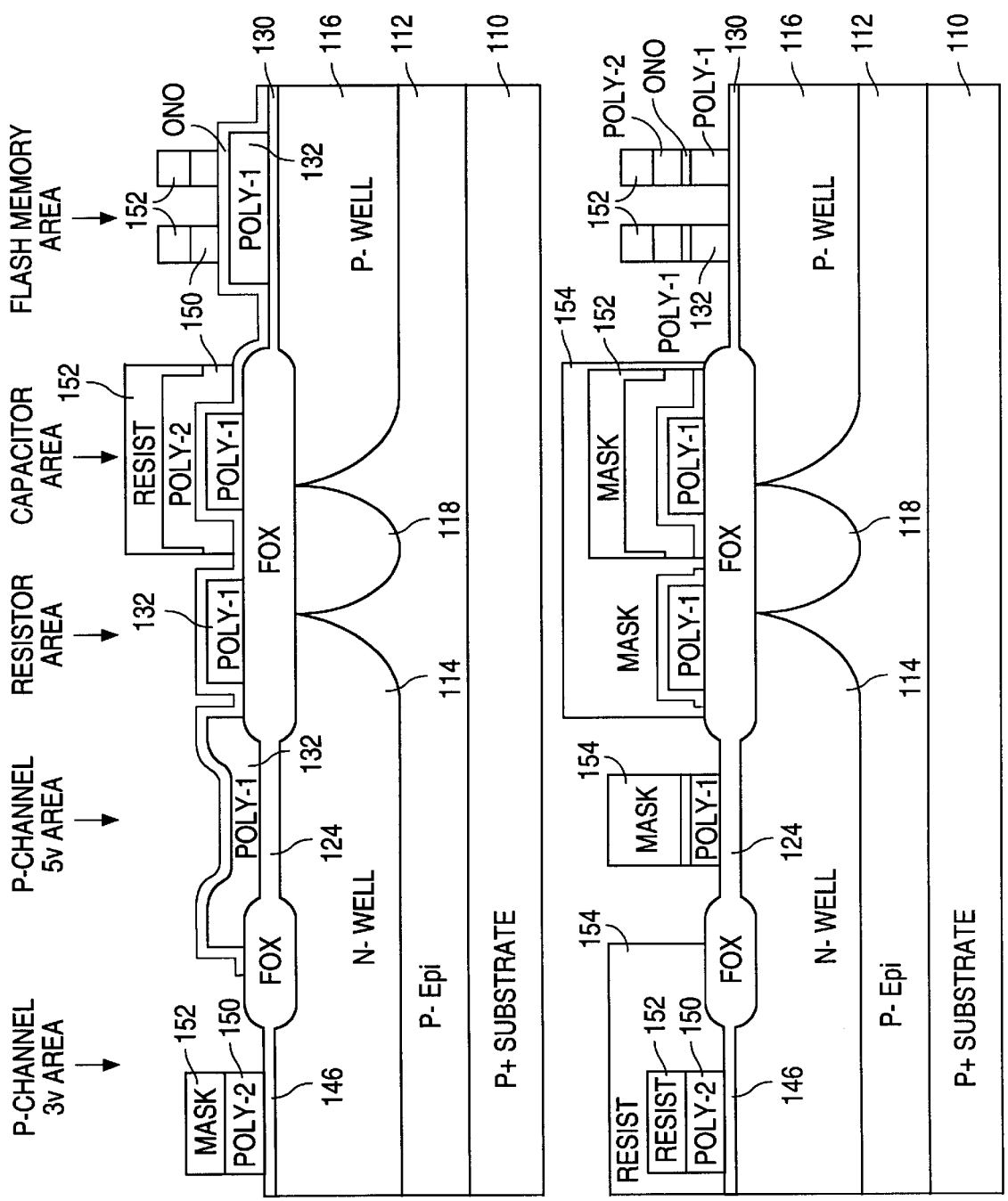

Next, as shown in FIG. 1I, a poly-2 mask 152 is formed and patterned to define the gates of the three-volt transistors, the upper plates of the capacitors, and the control gates of the FLASH EPROM cells. After this, poly-2 layer 150 is etched until the unmasked regions of poly-2 have been removed.

Poly-2 mask 152 is also used to form the word lines and interconnect lines of the device. If the critical dimensions of the gates of the three-volt transistors, the upper plates of the capacitors, and the control gates of the FLASH EPROM cells are not compatible, then additional masking steps are required.

Turning now to FIG. 1J, after the unmasked regions of poly-2 have been removed, a second poly-1 mask 154 is formed and patterned to protect the p-channel 3 V area, the resistor area, and the capacitor area, and to define the gates of the five-volt transistors.

As shown in FIG. 1J, the floating gates of the FLASH EPROM cells are also defined by utilizing mask 152. As a result, the critical dimensions can be optimized for the 5 V gates. (This process is commonly known as a self-aligned etch (SAE) since mask 152 is used to define both the control gates and the floating gates).

After the formation of mask 154, ONO layer 140 and the underlying poly-1 layer 132 are etched until the unmasked regions of ONO and poly-1 have been removed. Following this, both masks 152 and 154 are removed. Once masks 152 and 154 have been removed, a layer of poly seal oxide (not shown) is grown over all of the exposed regions of polysilicon.

Optionally, following the formation of the layer of poly seal oxide, drain pocket implants can be formed by masking and implanting the drain regions at an angle. The drain pocket implants are conventionally used to lower the electric field associated with the drain to prevent the formation of a punch through current.

Following the formation of the layer of poly seal oxide (or the formation of the optional pocket implants), the process continues with conventional back-end processing steps which include the formation of LDD source and drain regions, contacts, vias, and metal layers. (The implant mask conventionally used to form the LDD regions is also patterned to expose the source regions of the FLASH EPROM cells to the LDD implant. The conventional spacer structures and LDD source implants provides enough breakdown voltage and also helps reduce band-to-band tunnelling.)

Thus, a method has been described for forming three and five-volt MOS transistors (digital and analog, respectively), FLASH EPROM cells, poly resistors, and double-poly capacitors in a single integrated CMOS process flow.

As shown in FIG. 1J, the FLASH EPROM cells are formed as single-transistor memory cells. Several techniques for operating these cells under low-voltage bias conditions are described in U.S. patent application Ser. No. 08/422,146, U.S. Pat. No. 5,477,485, and U.S. Pat. No. 5,511,021, each of which are hereby incorporated by reference.

In addition to utilizing single-transistor memory cells, the process of the present invention can be modified to form the FLASH EPROM cells as two-transistor memory cells. In the two-transistor memory cell configuration, a floating-gate transistor is utilized to store data while a select transistor is utilized to control access to the floating-gate transistor. In accordance with the present invention, the select transistor can be formed as either a three-volt or a five-volt transistor.

FIGS. 2A–2J show cross-sectional drawings that illustrate a method for forming a mixed-signal CMOS device that includes a two-transistor memory cell configuration that utilizes a three-volt select transistor in accordance with the present invention.

As shown in FIGS. 2A–2B, the two-transistor memory cell method begins as described above, and then diverges from the process of FIGS. 1A–1J during the masking and implanting steps used to set the threshold voltages of the floating-gate transistors by forming mask 126 to cover the select transistor regions of the FLASH memory area.

Following this, the method returns to the process of FIGS. 1A–1J, and next diverges during the masking and implanting steps used to dope the resistor area and the floating-gate regions of poly-1 layer 132 by forming mask 134 to cover the select transistor regions of the FLASH memory area as shown in FIG. 2D.

Next, as shown in FIGS. 2E and 2F, masks 136 and 142 are modified to expose the select transistor regions of the FLASH memory area so that the poly-1 and ONO layers 132 and 140, respectively, can also be removed from the select transistor regions.

Figures 2G, 2H:
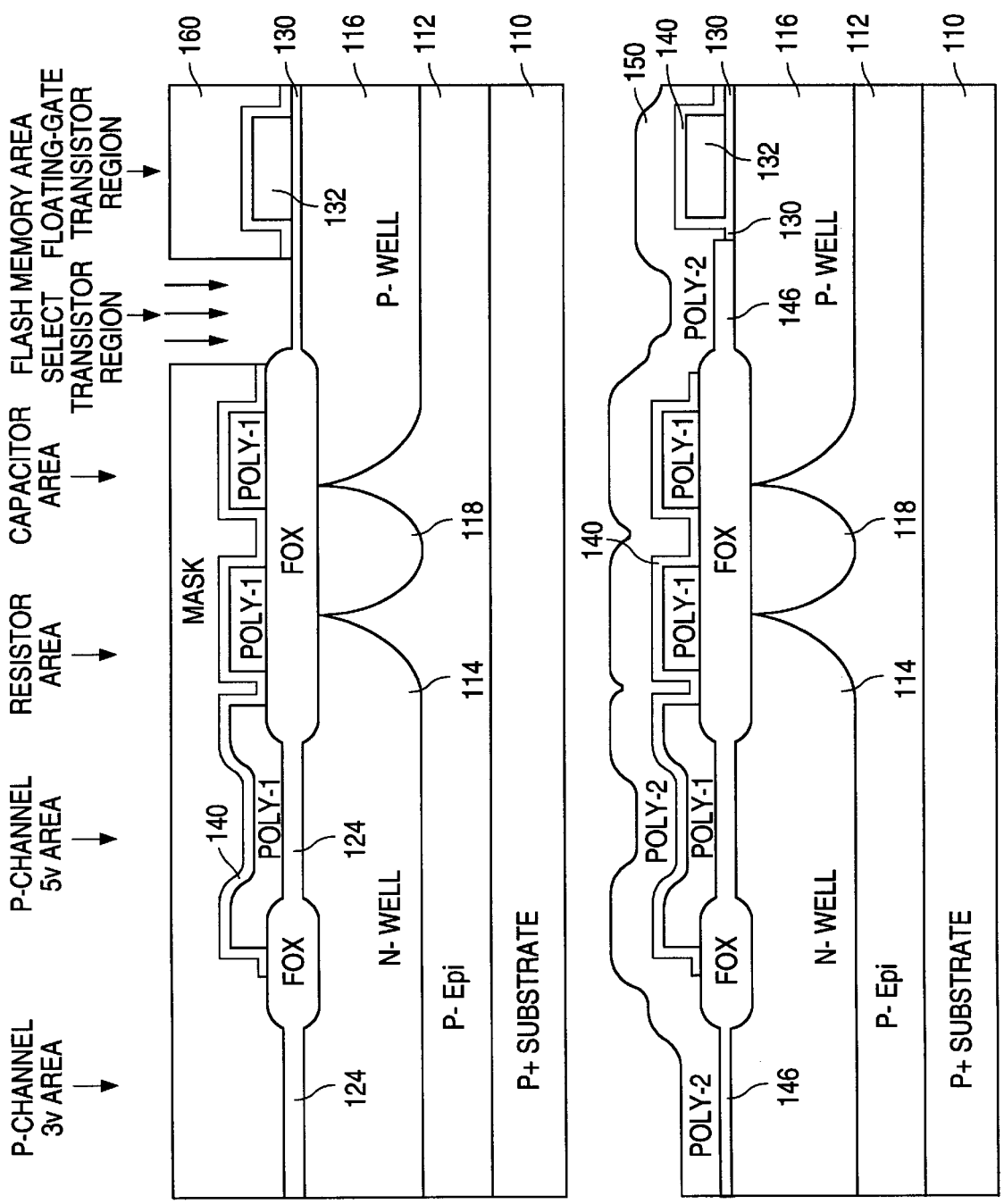

Following this, the threshold voltages of the select transistors are set at the same time that the threshold voltages for the 3 V transistors are set. FIG. 2G shows the formation of an n-channel 3 V threshold voltage mask 160 that exposes the select transistor regions of the FLASH memory areas. Similarly, the layer of gate oxide layer 146 is formed in the select transistor regions at the same time that the gate oxide layer is formed in the n-channel 3 V transistor regions.

Figures 2I, 2J:
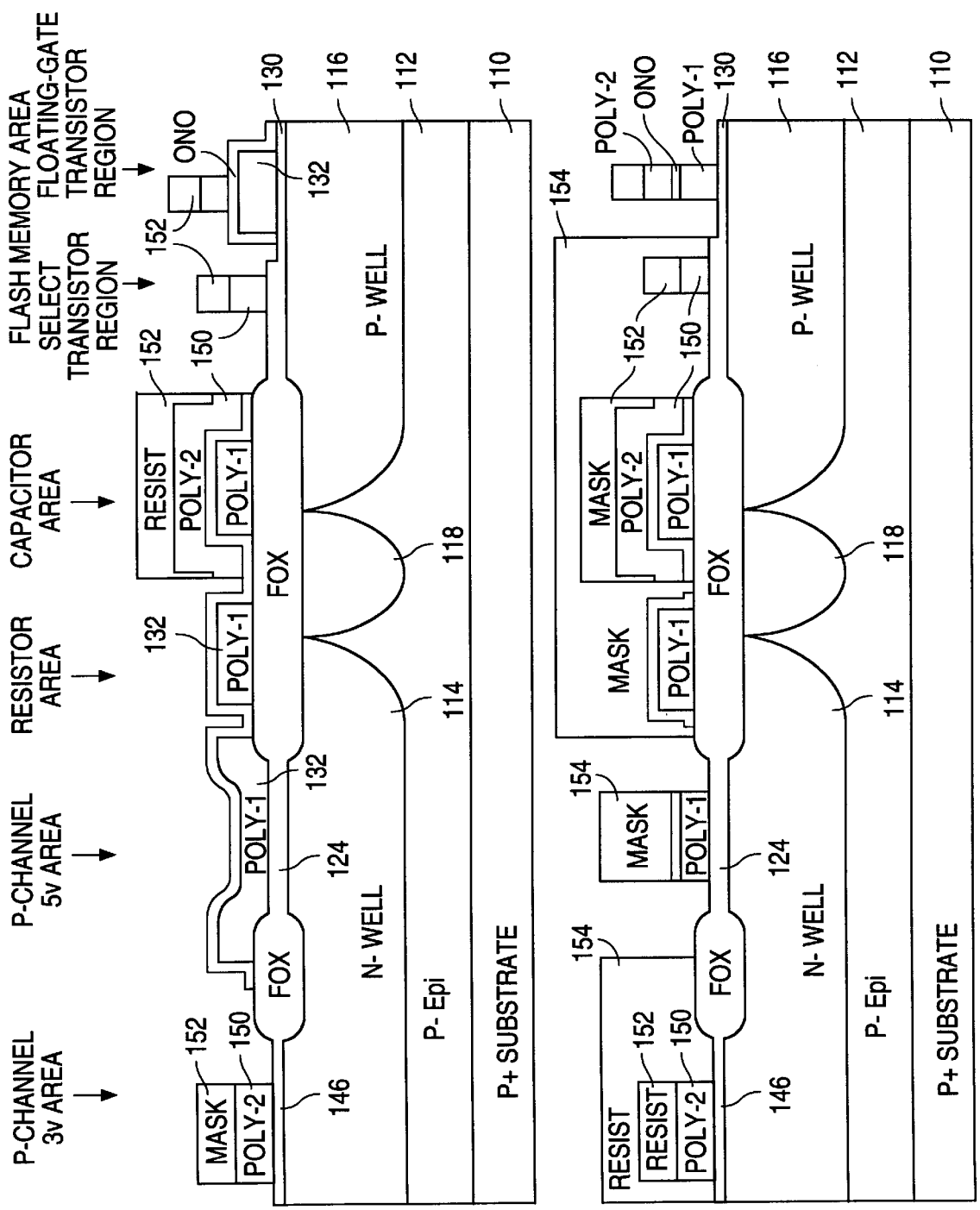
Figures 3A, 3B:
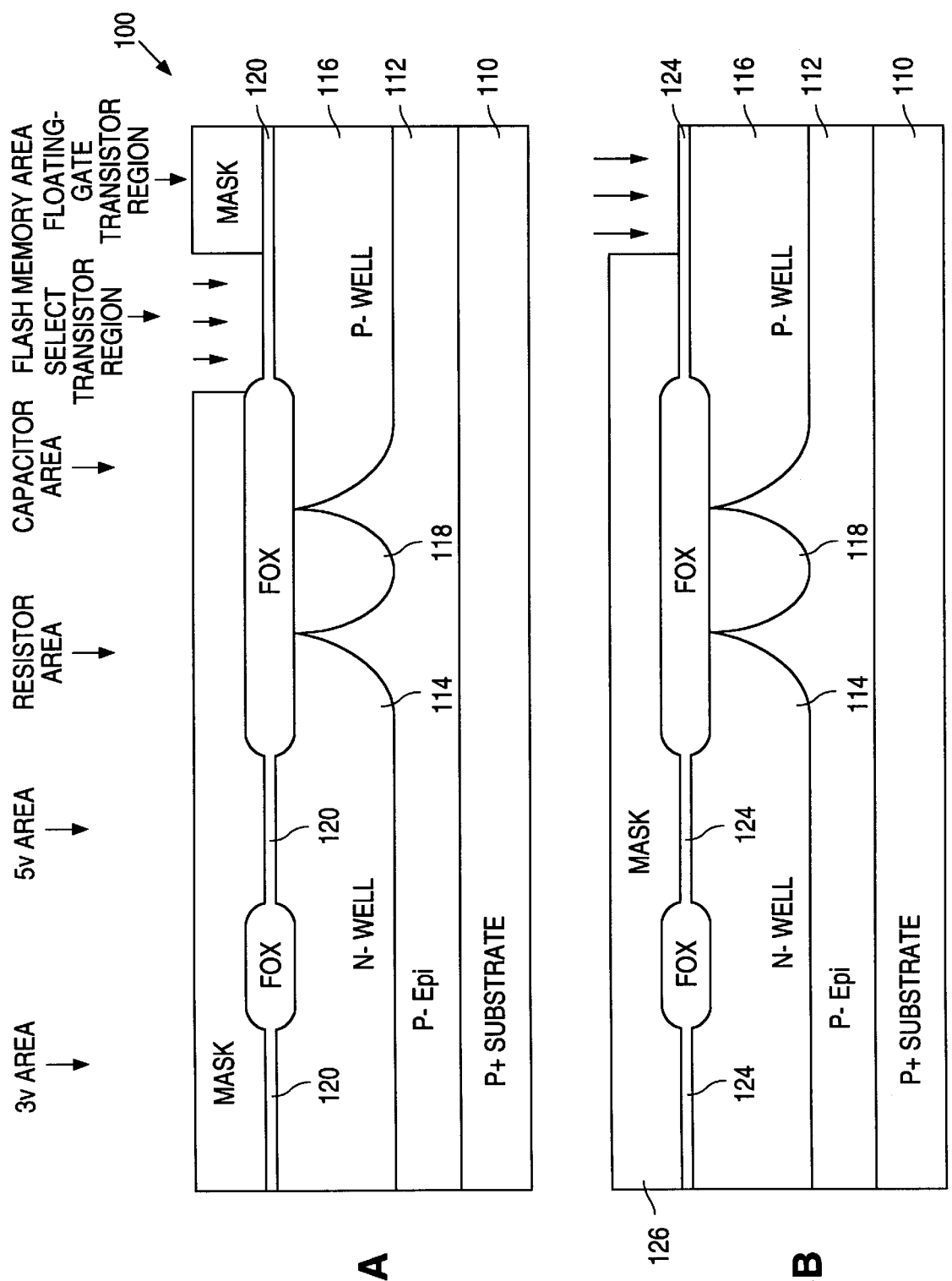

After this, the method returns to the process of FIGS. 1A–1J, and next diverges during the formation of the floating-gate structures by forming mask 154 to protect the select transistor region in the FLASH memory area as shown in FIG. 2J.

Thus, the method shown in FIGS. 2A–2J simply treats the select transistor regions of the FLASH memory area as another 3 V area. The same approach can also be used to form 5 V select transistors as shown in FIGS. 3A–3J.

Several techniques for operating the two-transistor memory cells under low-voltage bias conditions are described in U.S. patent application Ser. No. 08/654,103, which is hereby incorporated by reference.

It should be understood that various alternatives to the embodiment of the invention described herein may be employed in practicing the invention. For example, the resistors and/or capacitors can be deleted by simply modifying the masking and implanting steps to eliminate these structures.

In addition, rather than removing the layer of sacrificial oxide and then growing the layer of oxide 124 over each of the wells, a layer of gate oxide can be grown over each of the regions before the etching and implanting mask is removed. Further, the above process can be adopted for next generation 0.25 micron high-performance CMOS mixed-signal technology with full non-volatile memory function and low-voltage (2 V) operation. Thus, it is intended that the following claims define the scope of the invention and that methods and structures within the scope of these claims and their equivalents be covered thereby.

What is claimed is:

1. A method for forming first transistors in a first area of a semiconductor material, second transistors in a second area of the semiconductor material, and third transistors in a third area of the semiconductor material, the method comprising the steps of:

setting the threshold voltages of the first transistors in the first area;

forming a layer of first gate oxide over the first area;

setting the threshold voltages of the second transistors in the second area;

forming a layer of second gate oxide over the second area;

depositing a layer of first polysilicon (poly-1) over the first, second, and third areas;

selectively removing the layer of poly-1 from the first area to form a first region of poly-1, the second area to form a second region of poly-1, and the third area;

forming a layer of dielectric material over the first, second, and third areas;

removing the layer of dielectric material from the third area;

setting the threshold voltages of the third transistors in the third area;

forming a layer of third gate oxide over the third area;

forming a layer of second polysilicon (poly-2) over the first, second, and third areas;

selectively removing the layer of poly-2 to form a control gate in the second area, and a gate in the third area; and selectively removing the layer of dielectric material and the underlying layer of poly-1 to form a gate in the first area, and a floating gate in the second area.

2. The method of claim 1 wherein the layer of first gate oxide is formed after the threshold voltages have been set in the first area.

3. The method of claim 2 wherein the layer of second gate oxide is formed after the threshold voltages have been set in the second area.

4. The method of claim 3 wherein the layer of poly-1 is formed after the threshold voltages have been set in the first and second areas.

5. The method of claim 4 wherein the layer of dielectric material is formed after the formation of the first and second regions of poly-1.

6. The method of claim 5 wherein the threshold voltages are set in the third area after the layer of dielectric material has been removed from the third area.

7. The method of claim 6 wherein the layer of third gate oxide is formed after the threshold voltages have been set in the third area.

8. The method of claim 7 wherein the layer of poly-2 is formed over the first, second, and third areas after the layer of third gate oxide has been formed.

9. The method of claim 1 and further comprising the steps:

doping the layer of poly-1 formed over the second area to have a first doping concentration; and doping the layer of poly-1 formed over the first and third areas to have a second doping concentration.

10. A method for forming first transistors in a first area of a semiconductor material, second transistors in a second area of the semiconductor material, third transistors in a third area of the semiconductor material, resistors in a fourth area of the semiconductor material, and capacitors in a fifth area of the semiconductor material, the method comprising the steps of:

setting the threshold voltages of the first transistors in the first area;

forming a layer of first gate oxide over the first area after the threshold voltages have been set in the first area;

setting the threshold voltages of the second transistors in the second area after the layer of first gate oxide has been formed;

forming a layer of second gate oxide over the second area after the threshold voltages have been set in the second area;

depositing a layer of first polysilicon (poly-1) over the first, second, third, fourth, and fifth areas after the layer of second gate oxide has been formed;

selectively removing the layer of poly-1 from the first area to form a first region of poly-1, the second area to form a second region of poly-1, the third area, the fourth area to form the resistors, and the fifth area to form lower plates of the capacitors;

forming a layer of dielectric material over the first, second, third, fourth, and fifth areas after the first and second regions of poly-1 have been formed;

removing the layer of dielectric material from the third area;

setting the threshold voltages of the third transistors in the third area after the layer of dielectric material has been removed from the third area;

forming a layer of third gate oxide over the third area after the threshold voltages have been set in the third area;

forming a layer of second polysilicon (poly-2) over the first, second, third, fourth, and fifth areas after the layer of third gate oxide has been formed;

selectively removing the layer of poly-2 from the first area, the second area to form control gates in the second area, from the third area to form a gate, the fourth area, and the fifth area to form upper plates of the capacitors; and selectively removing the layer of dielectric material and the underlying layer of poly-1 from the first area to form a gate, and the second area to form floating gates.

11. A method for forming first transistors in a first area of a semiconductor material, second transistors in a second area of the semiconductor material, third transistors in a third area of the semiconductor material, and fourth transistors in a fourth area of the semiconductor material, the method comprising the steps of:

setting the threshold voltages of the first transistors in the first area;

forming a layer of first gate oxide over the first area;

setting the threshold voltages of the second transistors in the second area;

forming a layer of second gate oxide over the second area;

depositing a layer of first polysilicon (poly-1) over the first, second, third, and fourth areas;

selectively removing the layer of poly-1 from the first area to form a first region of poly-1, the second area to form a second region of poly-1, the third area, and the fourth area;

forming a layer of dielectric material over the first, second, third, and fourth areas;

removing the layer of dielectric material from the third and fourth areas;

setting the threshold voltages of the third transistors in the third area and the fourth transistors in the fourth area;

forming a layer of third gate oxide over the third area and the fourth area;

forming a layer of second polysilicon (poly-2) over the first, second, third, and fourth areas;

selectively removing the layer of poly-2 to form a control gate in the second area, a gate in the third area, and a gate in the fourth area; and selectively removing the layer of dielectric material and the underlying layer of poly-1 to form a gate in the first area, and a floating gate in the second area.

12. The method of claim 11 wherein the layer of first gate oxide is formed after the threshold voltages have been set in the first area.

13. The method of claim 12 wherein the layer of second gate oxide is formed after the threshold voltages have been set in the second area.

14. The method of claim 13 wherein the layer of poly-1 is formed after the threshold voltages have been set in the first and second areas.

15. The method of claim 14 wherein the layer of dielectric material is formed after the formation of the first and second regions of poly-1.

16. The method of claim 15 wherein the threshold voltages are set in the third and fourth areas after the layer of dielectric material has been removed from the third and fourth areas.

17. The method of claim 16 wherein the layer of third gate oxide is formed after the threshold voltages have been set in the third and fourth areas.

18. The method of claim 17 wherein the layer of poly-2 is formed over the first, second, third, and fourth areas after the layer of third gate oxide has been formed.

19. The method of claim 11 wherein the third and fourth transistors are formed in a single well.

20. A method for forming a semiconductor device on a semiconductor material that includes a first well region, a second well region, and a field oxide region formed between the first and second well regions, the first well region having a first transistor area, a second transistor area, and a doping concentration, the second well region having a transistor area and a doping concentration, the field oxide region having a resistor area and a capacitor area, the method comprising the steps of:

forming a layer of sacrificial oxide over the first and second transistor areas of the first well region, and the transistor area of the second well region;

adjusting the doping concentration at the surface of the first transistor area of the first well region;

removing the layer of sacrificial oxide;

forming a layer of first gate oxide over the first and second transistor areas of the first well region, and the transistor area of the second well region;

adjusting the doping concentration at the surface of the transistor area of the second well region;

removing the layer of first gate oxide from the transistor area of the second well region;

forming a layer of second gate oxide over the transistor area of the second well region;

depositing a layer of first polysilicon (poly-1) over the layer of first gate oxide, the layer of second gate oxide, and the field oxide region;

doping the layer of poly-1;

selectively removing the layer of poly-1 to expose the layer of first gate oxide formed over the second transistor area of the first well region, and to define a first region of poly-1 in the first transistor area, a resistor in the resistor area, the lower plate of a capacitor in the capacitor area, and a second region of poly-1 in the transistor area of the second well region;

forming a layer of dielectric material over the first region of poly-1 in the first transistor area, the resistor, the lower plate of the capacitor, the field oxide region, the second region of poly-1 and the layer of second gate oxide in the transistor area of the second well region, and the layer of first gate oxide in the second transistor area of the first well region;

removing the layer of dielectric material from the second transistor area of the first well region;

adjusting the doping concentration at the surface of the second transistor area of the first well region;

removing the layer of first gate oxide from the second transistor area of the first well region;

forming a layer of third gate oxide over the second transistor area;

forming a layer of second polysilicon (poly-2) over the layer of dielectric material and the layer of third gate oxide;

selectively removing the layer of poly-2 to form a gate in the second transistor area, the top plate of the capacitor in the capacitor area, and the control gate of a memory cell in the transistor area of the second well region, and to remove the layer of poly-2 from the layer of dielectric material formed over the first region of poly-1 and the resistor; and selectively removing the layer of poly-1 to form a gate in the first transistor area and the floating gate of the memory cell in the transistor area of the second well region.

21. A method for forming first transistors in a first area of a semiconductor material, second transistors in a second area of the semiconductor material, third transistors in a third area and fourth transistors in a fourth area of the semiconductor material, the method comprising the steps of:

setting the threshold voltages of the first transistors in the first area and the fourth transistors in the fourth area;

forming a layer of first gate oxide over the first area and the fourth area;

setting the threshold voltages of the second transistors in the second area;

forming a layer of second gate oxide over the second area;

depositing a layer of first polysilicon (poly-1) over the first, second, third, and fourth areas;

selectively removing the layer of poly-1 from the first area to form a first region of poly-1, the second area to form a second region of poly-1, the third area, and the fourth area to form a third region of poly-1;

forming a layer of dielectric material over the first, second, third, and fourth areas;

removing the layer of dielectric material from the third area;

setting the threshold voltages of the third transistors in the third area;

forming a layer of third gate oxide over the third area;

forming a layer of second polysilicon (poly-2) over the first, second, third, and fourth areas;

selectively removing the layer of poly-2 to form a control gate in the second area, and a gate in the third area; and selectively removing the layer of dielectric material and the underlying layer of poly-1 to form a gate in the first area, a floating gate in the second area, and a gate in the fourth area.

22. The method of claim 1 wherein the step of forming a layer of second gate oxide increases the thickness of the layer of first gate oxide.

23. The method of claim 10 wherein the step of forming a layer of second gate oxide increases the thickness of the layer of first gate oxide.

24. The method of claim 11 wherein the step of forming a layer of second gate oxide increases the thickness of the layer of first gate oxide.

25. The method of claim 20 wherein the step of forming a layer of second gate oxide increases the thickness of the layer of first gate oxide.

26. A method for forming first transistors in a first area of a semiconductor material, second transistors in a second area of the semiconductor material, and third transistors in a third area of the semiconductor material, the method comprising the steps of:

setting the threshold voltages of the first transistors in the first area;

forming a layer of first gate oxide over the first area;

setting the threshold voltages of the second transistors in the second area, and the third transistors in the third area;

forming a layer of second gate oxide over the second area and the third area;

depositing a layer of first polysilicon (poly-1) over the first, second, and third areas;

selectively removing the layer of poly-1 from the first area to form a first region of poly-1, the second area to form a second region of poly-1, and the third area to form a third region of poly-1;

forming a layer of dielectric material over the first, second, and third areas;

forming a layer of second polysilicon (poly-2) over the first, second, and third areas;

selectively removing the layer of poly-2 to form a control gate in the second area; and selectively removing the layer of dielectric material and the underlying layer of poly-1 to form a gate in the first area, a floating gate in the second area, and a gate in the third area.

* * * * *